United States Patent
Boström

(10) Patent No.: US 8,736,367 B2
(45) Date of Patent: May 27, 2014

(54) POWER AMPLIFIER WITH SWITCHING MEANS AND FEEDBACK CIRCUIT

(75) Inventor: Patrik Boström, Ramlösa (SE)

(73) Assignee: Etal Group AB, Vallingby (SE)

( * ) Notice: Subject to any disclaimer, the term of this patent is extended or adjusted under 35 U.S.C. 154(b) by 132 days.

(21) Appl. No.: 13/395,680

(22) PCT Filed: Sep. 8, 2010

(86) PCT No.: PCT/SE2010/050953
§ 371 (c)(1),
(2), (4) Date: May 24, 2012

(87) PCT Pub. No.: WO2011/031213
PCT Pub. Date: Mar. 17, 2011

(65) Prior Publication Data
US 2012/0235742 A1    Sep. 20, 2012

(30) Foreign Application Priority Data
Sep. 14, 2009 (SE) ...................................... 0950670

(51) Int. Cl.
*H03F 3/217* (2006.01)
(52) U.S. Cl.
USPC .................................................... 330/207 A
(58) Field of Classification Search
USPC ........................................ 330/10, 207 A, 251
See application file for complete search history.

(56) References Cited

U.S. PATENT DOCUMENTS

| | | |
|---|---|---|
| 4,041,411 A | 8/1977 | Sturgeon |
| 6,140,875 A | 10/2000 | Van Den Homberg |

(Continued)

FOREIGN PATENT DOCUMENTS

| | | |
|---|---|---|
| EP | 0817371 A1 | 1/1998 |
| JP | 2006174585 A | 6/2006 |

(Continued)

OTHER PUBLICATIONS

"PCT International Search Report for PCT/SE2010/0508953 dated Mar. 4, 2011, from which the instant application is based," 3 pgs.
"PCT International-Type Search Report dated Feb. 26, 2010 for related Swedish Application No. 09506700," 5 pgs.

*Primary Examiner* — Steven J Mottola
(74) *Attorney, Agent, or Firm* — Fredrikson & Byron, P.A.

(57) ABSTRACT

A power amplifier for amplifying an electric input signal in an operational frequency range and providing an output signal, comprising switching means (22), filter means (14, 15) for generating a power output signal by low pass filtering a block wave signal, input means for receiving the electric signal and feeding it to a first input of the switching means, the power amplifier further comprising a feedback circuit (24) connecting the output signal to the first input of the switching means. The power amplifier comprises a servo amplifier (32) connected to receive an error signal appearing at the first input of the switching means and to feed a correction output signal to a second input of the switching means (22) for neutralizing an impact of the error signal on the output signal. The invention relates to a method of amplifying an electric input signal in an operational frequency range. The method includes the steps of obtaining an error signal present at said first input of the switching means, amplifying the error signal in the operational frequency range, inverting the error signal and feeding the amplified and inverted error signal to a second input of the switching means.

10 Claims, 3 Drawing Sheets

(56) References Cited

U.S. PATENT DOCUMENTS

| | | | |
|---|---|---|---|
| 7,863,841 B2 * | 1/2011 | Menegoli et al. | 318/400.29 |
| 2004/0066229 A1 | 4/2004 | Taura | |
| 2004/0189377 A1 | 9/2004 | Lee | |
| 2004/0222845 A1 | 11/2004 | Yang et al. | |
| 2005/0200410 A1 | 9/2005 | Candy | |
| 2008/0284518 A1 | 11/2008 | Calo et al. | |
| 2009/0072902 A1 | 3/2009 | Cox | |

FOREIGN PATENT DOCUMENTS

| | | |
|---|---|---|
| WO | 03090343 A2 | 10/2003 |
| WO | 2006109245 A1 | 10/2006 |
| WO | 2008020384 A1 | 2/2008 |

* cited by examiner

POWER AMPLIFIER WITH SWITCHING MEANS AND FEEDBACK CIRCUIT

RELATED APPLICATIONS

This application is a 35 U.S.C. 371 national stage filing from International Application No. PCT/SE2010/050953 filed Sep. 8, 2010, and claims priority to Swedish Application No. 0950670-0 filed Sep. 14, 2009, the teachings of which are incorporated herein by reference.

TECHNICAL FIELD

Power amplifier for amplifying an electric input signal in an operational frequency range and providing an output signal, comprising switching means for generating a block wave signal by alternately switching the block wave signal to a first supply voltage or a second supply voltage, filter means for generating a power output signal by low pass filtering the block wave signal, input means for receiving the electric signal and driving the switching means, and a local feedback circuit connecting the output signal to an input of the switching means.

PRIOR ART

Switching power amplifiers also referred to as pulse modulation amplifiers, pulse width modulation (PWM) amplifiers or class D amplifiers are commonly used in applications where power dissipation is an important factor. Class d amplifiers are important for lowering power consumption and decreasing the size/weight and hence the use of raw materials.

In such amplifiers there is an input stage for receiving an electrical input signal to be amplified, a modulating/switching or power stage and a filter. The switching stage generates a block wave signal, or a pulse train, which has a frequency that is much higher than the highest frequency in the operational frequency range of the electric signal to be amplified. The pulse width ratio of the block wave is modulated so that the average value of the block wave signal is proportional to the input signal. The filter filters the block wave signal to a power output signal.

Another definition of class d amplifiers is that the power stage which delivers the energy to the load is operated in an "on/off" state where the average voltage value of this square wave is modulated to correspond to the set value. The only losses that appear are the low conduction losses during the "on" state and the switching losses from each time the output stage changes state.

The switching between on and off is made at a frequency which normally is around 400 kHz or more giving a high enough resolution in the audible band. Normally, a class d amplifier contains a second order low pass filter with a preferably high Q value for demodulating the PWM pulses. This filter shifts the phase assymptotically towards −180° and the higher the Q value the faster it reaches −180°. When the filter is loaded the Q value decreases.

The actual pulse width modulation can be performed in several different ways. The most obvious way is to use a reference signal, for example a tri wave signal and then compare the input or set value to this reference signal. Each time those signals intersect the output stage changes state. A disadvantage with this reference signal technique is that the average value of the pulse train only corresponds to the set value as long as the supply voltages are constant and the state shift is infinitely fast plus of course, the tri wave has to be ideal.

The reference signal technique does not have any feedback what so ever resulting in an absence of control over the demodulation filter. There is actually two signal paths, one from the input to the output and one from the supply rails to the output. The channel separation and power supply rejection become very poor. One single advantage is that the switching frequency is constant. Supply feed forward can be used to lower the supply voltage dependence.

Using a digital device as a DSP for calculating the pulse width instead of comparing the set value to a tri wave signal basically gives the same result. However there are more possibilities to compensate for non ideal features of components. A DSP solution also is more complicated and expensive.

A very effective way of providing the pulse width modulation is by self oscillation. A comparator is used to compare the average of the pulse train to the set value giving an error as a result. If the error is negative the positive switch is turned on and vice versa if it is positive. The frequency of operation is close to the frequency where the loop has −180° phase shift. Some solutions use the demodulation filter to do the averaging and this gives the amplifier the possibility to adjust errors that occur in and after the demodulation filter.

Without additional circuitry the switching frequency would be equal to the filter resonance frequency which usually is around 50 kHz and this is not acceptable. A zero and zero cancelling resistor is added in the sensing circuit to push the frequency up about a decade. This zero increases the amplitude of the modulation signal and this decreases the loop gain hence increases the non linearities. The result of this post filter self oscillating topology is therefore that the linear distorsion (distorsion which does not add new frequency content like amplitude and phase) is very low for being a class d amplifier but the non linear distorsion is poor. An early disclosure of a self oscillation class D amplifier was made by Clayton Sturgeon in Texas who filed a patent application in 1976 with serial number U.S. Pat. No. 4,041,411.

A later prior art document is WO03/090343 disclosing a power amplifier for amplifying an electric signal in an operational frequency range comprising switching means for generating a block wave signal by alternately switching the block wave signal to a first supply voltage or a second supply voltage, filter means for generating a power output signal by low pass filtering the block wave signal, input means for receiving the electric signal and driving the switching means, and a control circuit coupled to the output power signal and the input means for controlling the power amplifier.

A further option is to add a second order active integrator which demodulates the pulse train and gives an enormous amount of loop gain at low frequencies. The switching frequency is then entirely controlled by this integrator and not at all by the Q value of the output filter. The operation of this pre filter self oscillating topology is therefore very robust and simple and it gives very low non linear distorsion, especially at low frequencies.

However, in a pre filter self oscillating topology the linear distortion becomes high i.e. the frequency response and phase is totally load dependant and a desired response curve can only be obtained with specific load impedance. The switching frequency of all self oscillating topologies varies with the modulation depth (pulse width). This is an advantage for the efficiency as the switching losses becomes lower as the conduction losses increase but if another loop is added to increase the loop gain there is a risk that this loop picks up the switching frequency and then the amplifier would go into a destructive sub harmonic oscillation condition.

There is a need to increase the loop gain in order to lower the non linear and linear distorsion of self oscillating class d amplifiers. This is usually done by including an integrator which integrates the difference between the output signal and input signal, forming an error signal, to further increase the loop gain in the audible band and hence lowering the non idealities in the audible band. This gives at least one problem. At start up, before the class d stage starts to operate, or during output clipping the integrator will be fed a large error signal which will be integrated until the integrator saturates and then the error keeps charging an integrating capacitor. This causes the integrator to hang up.

Thus, there is a desire to remove this hang up behaviour in order to be able to use an integrator in combination with a class d amplifier stage.

SUMMARY OF THE INVENTION

In accordance with the invention the drawbacks and problems of prior art amplifiers are overcome by providing a self oscillating class D amplifier having lower distortion without affecting the frequency response of the same. This is done by adding a circuit which measures the error on the negative input of a modulating/switching or power stage of the class D amplifier and then acts on a positive input (a reference of the modulating stage) to reduce this error. This type of amplifier will have a very low linear distorsion compared to other class d amplifiers. A further advantage is that the frequency response of the class D stage is not affected by the error amplifier.

The frequency response shows large bandwidth and the output impedance is low. By adding an error servo the non linear distortion can be substantially reduced. In various embodiments the servo comprises an integrator which measures the error on the negative input of the modulator, amplifies it in the audio range, inverts it and then feeds it onto the positive input of the modulator (the modulator reference).

In order to make the amplifier behave well during clipping and during startup the integrator may be provided with a clamp, so as to limit the integrating signal. The clamp can be connected across an integrating capacitor included in the integrator. In various embodiments the clamp comprises two zener diodes that will turn the integrator into a follower if the voltage across the integrating capacitor exceeds the zener voltage plus 0.7V in either direction. Other ways are available to realize this clamp.

A practical embodiment of the invention was compared to a standard globally modulated class D stage with reference to frequency response and phase shift. In a standard class D stage the −3 dB point of amplification is at 235 kHz and the absolute phase shift at 20 kHz is −8 degrees. An embodiment in accordance with the invention with an added error servo shows a −3 dB point at 230 kHz and −10 degrees phase shift at 20 kHz. Thus, the frequency response is practically unchanged as compared to a class D stage by itself. This result is achieved by a servo, or error amplifier, which measures an error in a modulation node and corrects it by applying it to a reference of the modulator.

BRIEF DESCRIPTION OF THE DRAWINGS

In order that the manner in which the above recited and other advantages and objects of the invention are obtained will be readily understood, a more particular description of the invention briefly described above will be rendered by reference to specific embodiments thereof which are illustrated in the appended drawings.

Understanding that these drawings depict only typical embodiments of the invention and are not therefore to be considered to be limiting of its scope, the invention will be described and explained with additional specificity and detail through the use of the accompanying drawings in which.

DETAILED DESCRIPTION

Figure 1:
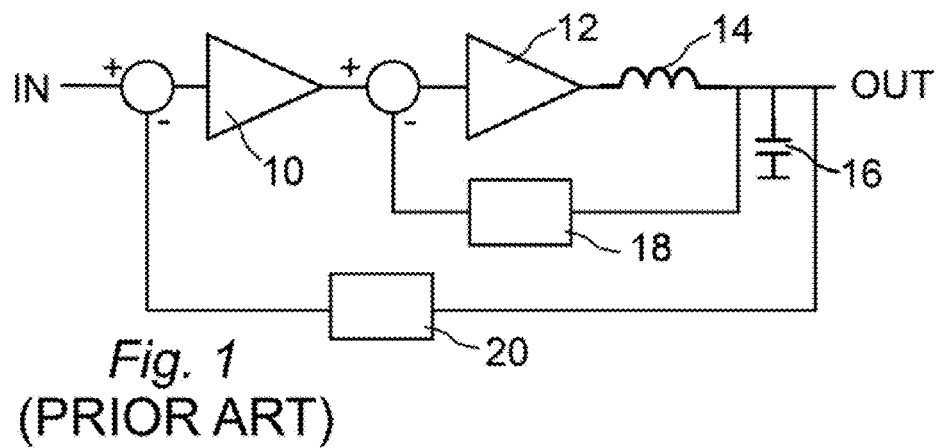
FIG. 1 is a schematic block diagram of a prior art class D amplifier.

In the prior art amplifier shown in FIG. 1 a non-inverting first input of an integrator circuit 10 receives an electric input signal. An output of the integrator circuit 10 is connected to a switching means 12. A power output from the switching means 10 is connected to a low pass filter comprising an inductor 14 and a capacitor 16. From the inductor 14 a local feedback loop 18 connects to an inverting input of the switching means 13. A non-inverting input of the switching means 13 is connected to an output of the integrator circuit 10. A global feedback loop 20 connects the inductor 14 to an inverting second input of the integrator circuit 10. During clipping conditions the integrator hangs up and this causes a high amount of audible artefacts. A possible improvement would be to keep the supply voltage at a lower level in order to limit how much the integrator hangs up but this would not solve the issues during startup or current limit situations.

Figure 2:
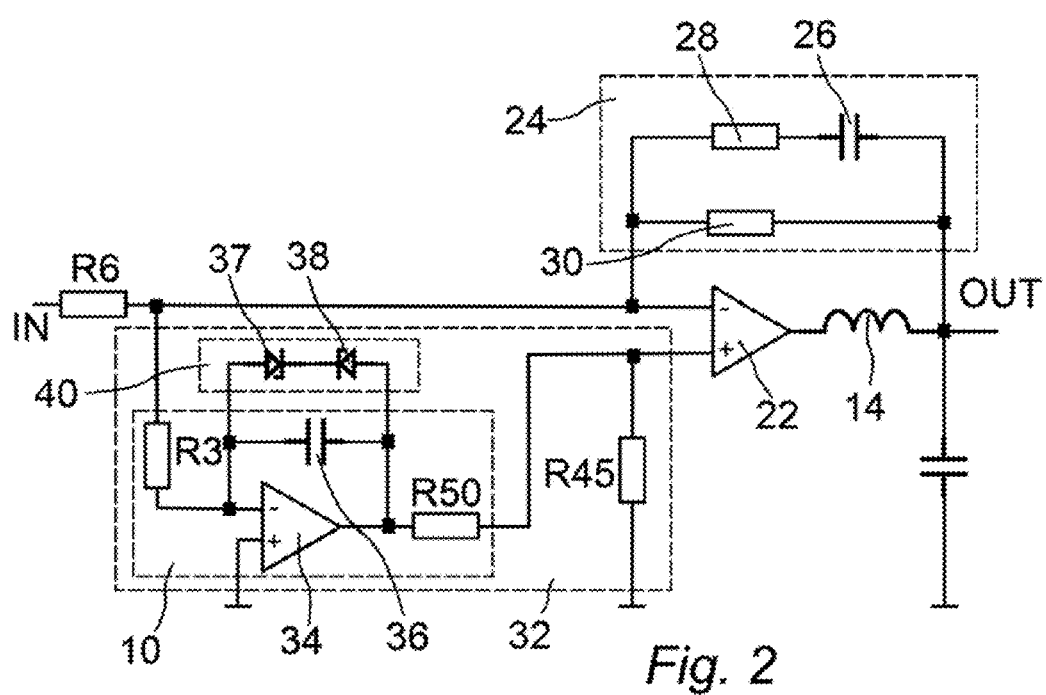
FIG. 2 is a schematic block diagram of a basic embodiment of an amplifier in accordance with the invention.

In the embodiment of an amplifier in accordance with the invention shown in FIG. 2 an output of a comparator 22 operating as switching means is connected to a signal output OUT through an inductor 14 in a conventional manner. A signal input IN is fed to an inverting input of the comparator through a resistor R6 and through a further resistor R3. The inverting input of the comparator is a modulation node of the amplifier. A feedback loop 24 is provided between the signal output and the inverting input of the comparator. The signal appearing at the inverting input of the comparator can be defined as an error signal. In the shown embodiment the feedback loop comprises a feedback capacitor 26 in series with a feedback resistor 28. A parallel resistor 30 also is included in the feedback loop 24. In the shown embodiment an inductor 14 is provided between the output of the comparator 22 and the signal output OUT.

In the prior art amplifier shown in FIG. 1 the global feedback loop is used to compare the output signal to the input signal. In accordance with the invention a servo 32, or error amplifier, is connected to measure the error signal appearing at the modulation node of the comparator. The error signal then is amplified in the audio range and inverted to produce a correction output signal. The correction output signal is fed to non-inverting input of the comparator, normally being the modulator reference. As a result the impact of the error signal is neutralized.

As shown in FIG. 2 the modulation node is connected to the servo 32 and more specifically to an inverting input of an integrator 34 forming part of an integrator circuit 10. The integrator circuit 10 further comprises an integrating capacitor 36 connected between an output of the integrator 34 and the inverting input of the integrator 34. The output of the integrator 34 is connected to the non-inverting input of the comparator 22 through a line resistor R50. The non-inverting input of the comparator 22 further is connected to ground through a resistor R45.

The embodiment shown in FIG. 2 also comprises a clamp 40 to improve the properties of the amplifier during clipping and during start up conditions. The clamp comprises a first zener diode 37 and a second zener diode 38 that are connected in series and in opposite directions across the integrating capacitor 36. The two zener diodes 37, 38 turn the integrator circuit into a follower if the voltage across the integrating capacitor exceeds the zener voltage plus 0.7V in either direction. There are other ways to realize the clamp.

Figure 3:
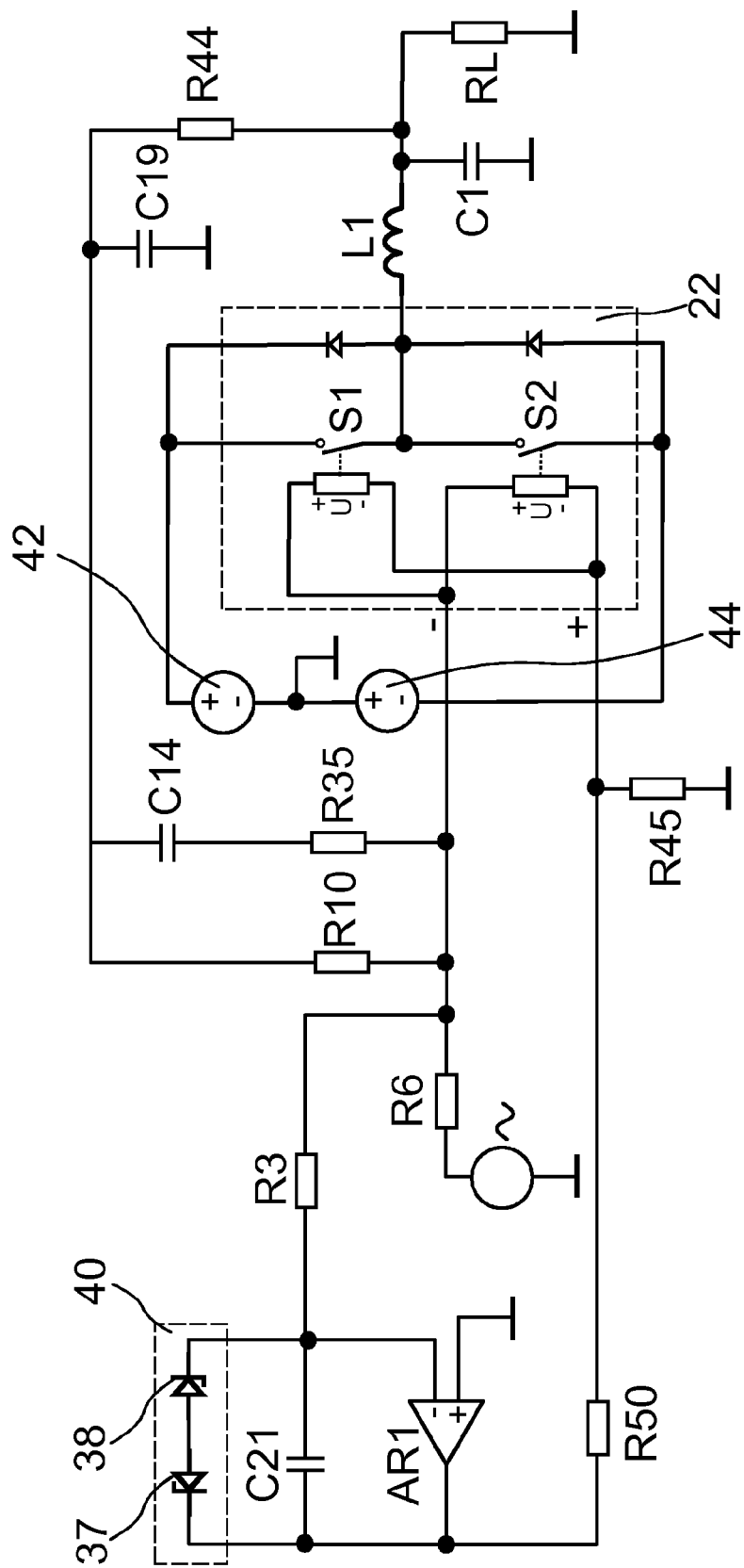
FIG. 3 is a schematic circuit diagram of one embodiment of an amplifier in accordance with the invention and FIG. 4 is a schematic block diagram showing an alternative embodiment of a limiter.

A simulation model of a post filter self oscillation class d amplifier stage with an error servo to increase the loop gain in the audio band is shown in FIG. 3. Below only components with appreciable properties in a technical sense are mentioned specifically.

A first switch S1 switches on at 0.001V and switches off at 0V. A second switch S2 has opposite turn on and turn of values. Switches S1 and S2 are connected to a first voltage source 42 and a second voltage source 44, respectively. Voltage sources 42 and 44 supply the required or available voltage, such as 50V in the shown embodiment. Together S1 and S2 form the switching means 22 based on a comparator and power stage. Resistor R44 and capacitor C19 approximate the propagation delay in the comparator—switch stage (which is there in real life). The output of the switching means 22 is fed through inductor 14 and received by a load RL.

Amplifier circuit AR1 forms the integrator circuit 10 where capacitor C21 functions as a pole. In the shown embodiment AR1 has +/−15V as supply voltage. Capacitor C14 and resistor R35 pushes the switching frequency away from the filter resonance frequency up to a desired much higher frequency.

The components used in the embodiment shown in FIG. 3 are listed in the table below.

| Comp. | Value |
| --- | --- |
| R3 | 2 kOhm |
| R6 | 2 kOhm |
| R10 | 8.2 kOhm |
| R35 | 1.1 kOhm |
| R44 | 10 Ohm |
| R45 | 6 kOhm |
| R46 | 2 kOhm |
| R50 | 2 kOhm |
| C1 | 1 µF |
| C14 | 130 pF |
| C19 | 20 nF |
| C21 | 1.2 nF |
| L1 | 8 µH |

Figure 4:
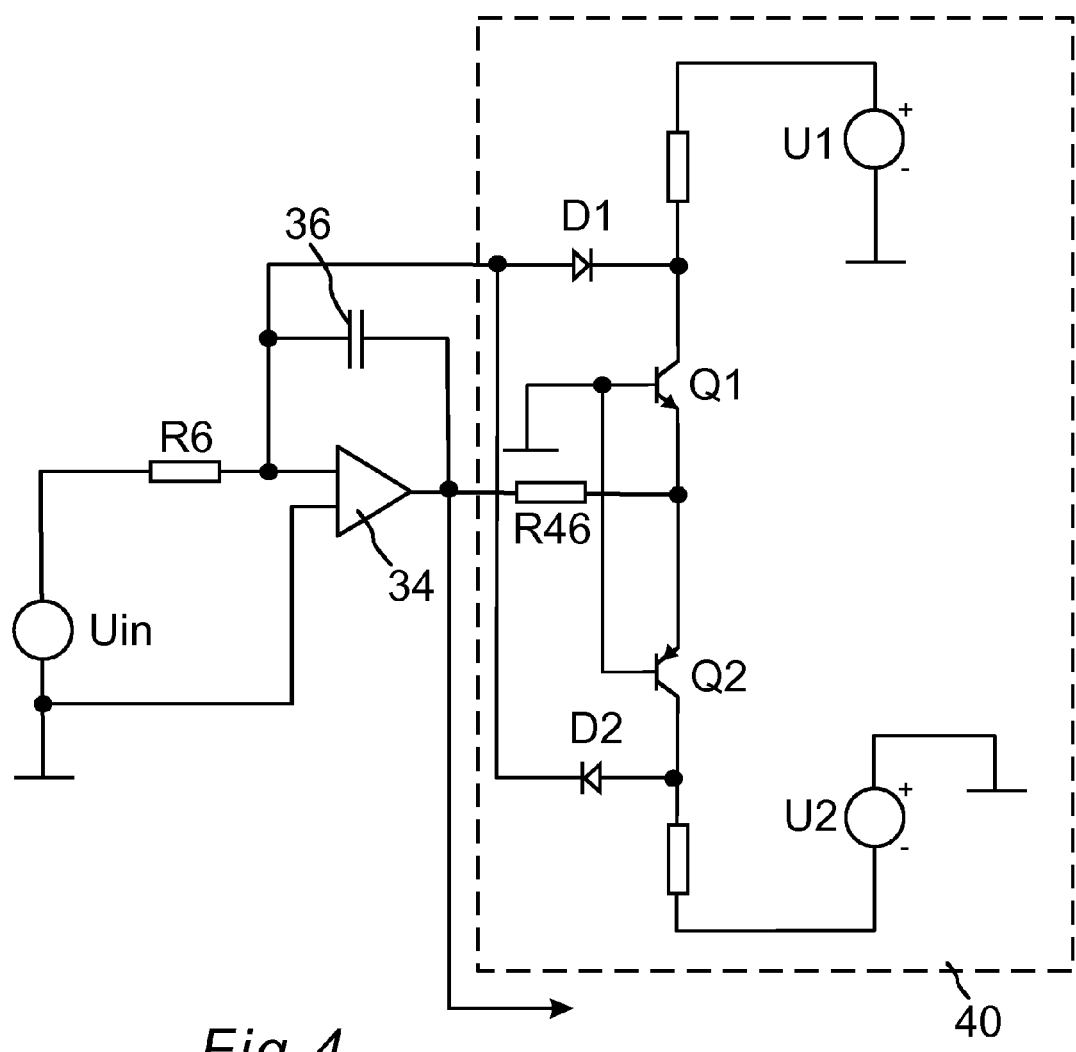

A more ideal limiter or clamp 40 is shown in FIG. 4. First transistor Q1 will be activated or conduct when an output of the integrator 34 falls below −0.7 V. As a result the integrator output will be connected back to the inverting input of the integrator 34 through first transistor Q1 and first diode D1. Correspondingly, second transistor Q2 will be activated or conduct when an output of the integrator 34 will increase to a value above 0.7 V.

Transistors Q1 and Q2 are conventional transistors and diodes D1 and D2 are conventional diodes. Resistors R8 and R9 are used to put the diodes in the reverse biased condition when transistors Q1 and Q2 are not conducting. The output of the integrator is fed to the comparator 22 as described above.

While certain illustrative embodiments of the invention have been described in particularity, it will be understood that various other modifications will be readily apparent to those skilled in the art without departing from the scope and spirit of the invention. Accordingly, it is not intended that the scope of the claims appended hereto be limited to the description set forth herein but rather that the claims be construed as encompassing all equivalents of the present invention which are apparent to those skilled in the art to which the invention pertains.

The invention claimed is:

1. A power amplifier for amplifying an electric input signal in an operational frequency range and providing an output signal, comprising switching means for generating a block wave signal by alternately switching the block wave signal to a first supply voltage or a second supply voltage, filter means for generating a power output signal by low pass filtering the block wave signal, input means for receiving the electric signal and feeding it to a first input of the switching means, a feedback circuit connecting the output signal to the first input of the switching means, and a servo amplifier connected to receive an error signal appearing at the first input of the switching means and to feed a correction output signal to a second input of the switching means for neutralizing an impact of the error signal on the output signal.

2. The power amplifier of claim 1, wherein the servo amplifier has a first amplifying input connected to the first input of the switching means and an output connected to a second input of the switching means and wherein the servo amplifier is designed to amplify the error signal and to invert the error signal before feeding it to the second input of the switching means.

3. The power amplifier of claim 1, wherein the servo amplifier comprises an integrator having a non-inverting input, an inverting input, an integrator output, and an integrating capacitor connected between the integrator output and the inverting input.

4. The power amplifier of claim 3, wherein a clamp is provided to limit an integrating signal appearing at the output of the integrator.

5. The power amplifier of claim 4, the clamp comprises a first zener diode and a second zener diode that are connected in series and in opposite directions across the integrating capacitor.

6. The power amplifier of claim 3, wherein the integrator output of the integrator is connected to the second input of the switching means through a line resistor, said second input being a non-inverting input.

7. The power amplifier of claim 1, wherein the first input of the switching means is an inverting input.

8. The power amplifier of claim 1, wherein the operational frequency range is an audible frequency band.

9. The power amplifier of claim 1, wherein the switching means comprises a first switch and a second switch, the first switch switching in a first voltage source and the second switch switching in a second voltage source to form the output signal.

10. A method of amplifying an electric input signal in an operational frequency range and providing an output signal, comprising generating a block wave signal by alternately switching the block wave signal to a first supply voltage or a second supply voltage, low pass filtering the block wave signal, providing a local feedback of the output signal to a first input of the switching means, obtaining an error signal present at said first input of the switching means, amplifying the error signal in the operational frequency range, inverting the error signal, and feeding the amplified and inverted error signal to a second input of the switching means.

\* \* \* \* \*